(12) United States Patent
Kang

(10) Patent No.: US 8,598,505 B2
(45) Date of Patent: Dec. 3, 2013

(54) METHOD AND APPARATUS FOR CANCELLATION OF TRANSIENT VOLTAGE SPIKE

(75) Inventor: Sae-Kyoung Kang, Daejeon (KR)

(73) Assignee: Electronic and Telcommunications Research Institute, Daejeon (KR)

( * ) Notice: Subject to any disclaimer, the term of this patent is extended or adjusted under 35 U.S.C. 154(b) by 425 days.

(21) Appl. No.: 12/908,498

(22) Filed: Oct. 20, 2010

(65) Prior Publication Data

US 2011/0133058 A1 Jun. 9, 2011

(30) Foreign Application Priority Data

Dec. 4, 2009 (KR) .................. 10-2009-0119961
Mar. 29, 2010 (KR) .................. 10-2010-0028111

(51) Int. Cl.
*H01J 40/14* (2006.01)
*H03F 3/08* (2006.01)

(52) U.S. Cl.
USPC .................. 250/214 R; 250/214 C; 257/431

(58) Field of Classification Search
USPC ...... 250/214.1, 214 A, 214 C, 214 R; 257/431
See application file for complete search history.

(56) References Cited

U.S. PATENT DOCUMENTS

2008/0217516 A1* 9/2008 Suzuki et al. ............. 250/214 A

FOREIGN PATENT DOCUMENTS

KR 10-0374886 2/2003

OTHER PUBLICATIONS

Z.L. Yaun, et al., "High speed single photon detection in the near-infrared", Applied Physics Letters 91, 041114-04114-3 pp(2007).
S.J. Dimler, et al., "Capacitive quenching measurement circuit for Geiger-mode avalanche photo-diodes", IEEE Journal of Selected Topics in Quantum Electronics; vol. 13, No. 4; 919-925.

* cited by examiner

*Primary Examiner* — Francis M Legasse, Jr.
(74) *Attorney, Agent, or Firm* — Staas & Halsey LLP

(57) ABSTRACT

An apparatus for cancellation of a transient voltage spike, includes: a first photodiode for detecting a photon in an optical signal input from an outside, a second photodiode for detecting the photon in the optical signal input from the outside, and a differential amplifier for canceling the same signal component in a first output signal of the first photodiode and a second output signal output from the second photodiode, and to amplify a voltage difference between the first output signal and the second output signal. The transient voltage spike cancellation apparatus cancel a transient voltage spike occurring in an avalanche photodiode operating in a gated Geiger mode, using the differential amplifier.

7 Claims, 3 Drawing Sheets

US 8,598,505 B2

METHOD AND APPARATUS FOR CANCELLATION OF TRANSIENT VOLTAGE SPIKE

CROSS-REFERENCE TO RELATED APPLICATION

This application claims priority to and the benefit of Korean Patent Application Nos. 10-2009-0119961 and 10-2010-0028111 filed in the Korean Intellectual Property Office on Dec. 4, 2009 and Mar. 29, 2010, the entire contents of which are incorporated herein by reference.

BACKGROUND OF THE INVENTION (a) Field of the Invention

The present invention relates to a method and an apparatus for cancellation of a transient voltage spike. More particularly, the present invention relates to a method and an apparatus for cancellation of a transient voltage spike occurring in a single photon detector.

(b) Description of the Related Art

In a quantum cryptography communication system, a receiver may detect a single photon using an avalanche photodiode.

Since an intensity of light corresponding to a single photon level is applied in the receiver, it is difficult for the receiver to detect an optical signal using the avalanche photodiode. Accordingly, the receiver may operate the avalanche photodiode in a gated Geiger mode and detect an optical signal corresponding to a single photon. Here, when a voltage pulse is applied to an inverse-bias of the avalanche photodiode around a breakdown voltage, it is possible to obtain an infinite instant gain.

On the other hand, when a gating pulse and a direct current (DC) voltage corresponding to a breakdown voltage are applied to a negative electrode of the avalanche photodiode, a voltage signal component may be combined with a positive electrode due to a parasitic capacitance component of the avalanche photodiode.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provides a method and apparatus for cancellation of a transient voltage spike of an avalanche photodiode.

An exemplary embodiment of the present invention provides an apparatus for cancellation of a transient voltage spike, including:

a first photodiode for detecting a photon in an optical signal input from an outside; a second photodiode for detecting the photon in the optical signal input from the outside; and a differential amplifier for canceling the same signal component in a first output signal of the first photodiode and a second output signal output from the second photodiode, and to amplify a voltage difference between the first output signal and the second output signal.

Another embodiment of the present invention provides a method for cancelling, by an apparatus comprising a first photodiode, a second photodiode, and a differential amplifier, a transient voltage spike, including:

providing with, a gating pulse and a direct current (DC) voltage corresponding to a breakdown voltage; detecting, by each of the first photodiode and the second photodiode, a photon in an input optical signal; and receiving, by the differential amplifier, a first output signal of the first photodiode and a second output signal output from the second photodiode to cancel the same signal component included alike in the first output signal and the second output signal, thereby cancelling the transient voltage spike.

DETAILED DESCRIPTION OF THE EMBODIMENTS

Figure 1:
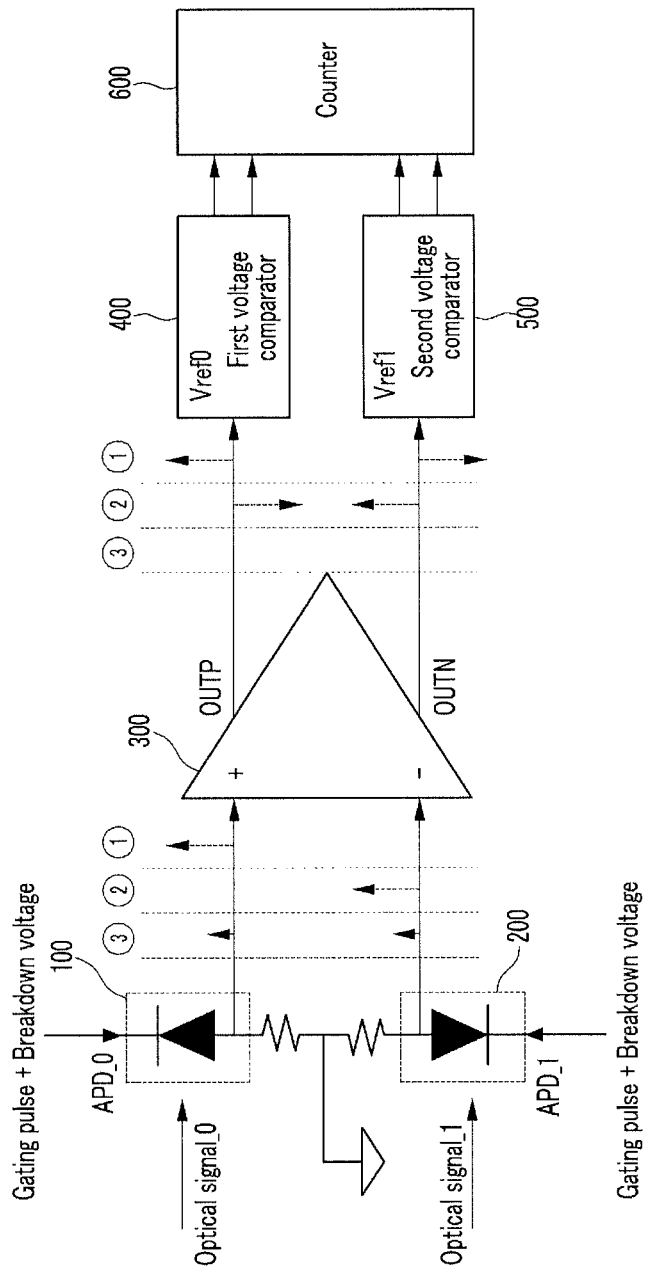
FIG. 1 is a diagram illustrating an apparatus for cancellation of a transient voltage spike according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In specification and the claims that follow, when it is described that an element is "coupled" to another element, the element may be "directly coupled" to the other element or "electrically coupled" to the other element through a third element.

In specification, unless explicitly described to the contrary, the word "comprise" and variations such as "comprises" or "comprising", will be understood to imply the inclusion of stated elements but not the exclusion of any other elements.

Hereinafter, a method and an apparatus for cancellation of a transient voltage spike according to an exemplary embodiment of the present invention will be described in detail with reference to the accompanying drawings.

FIG. 1 is a diagram illustrating an apparatus for cancellation of a transient voltage spike according to an exemplary embodiment of the present invention.

Referring to FIG. 1, the transient voltage spike cancellation apparatus may include two avalanche photodiodes (hereinafter, "APD"), that is, a first APD 100 and a second APD 200, a differential amplifier 300, two voltage comparators (Comparator_0 and Comparator_1), that is, a first voltage comparator 400 and a second voltage comparator 500, and a counter 600.

An anode of the first APD 100 is connected to a first input terminal (+) of the differential amplifier 300, and an anode of the second APD 200 is connected to a second input terminal (−) of the differential amplifier 300. Also, a resistance R is connected between the anode of the first APD 100 and a ground, and between the anode of the second APD 200 and the ground.

A first output terminal (OUTP) of the differential amplifier 300 is connected to the first voltage comparator 400. Also, a second output terminal (OUTN) of the differential amplifier 300 is connected to the second voltage comparator 500.

According to an exemplary embodiment of the present invention, a gating pulse and a direct current (DC) voltage corresponding to a breakdown voltage may be applied to a cathode of each of the first APD 100 and the second APD 200. Also, each of the first APD 100 and the second APD 200 may detect a photon (hereinafter, "photon signal") in respective transferred optical signals (optical signal_0, optical signal_1).

The differential amplifier 300 may cancel the same signal component in a first output signal of the first APD 100 and a second output signal of the second APD 200, and may amplify a voltage difference between the first output signal and the second output signal. In this instance, when each ADP detects the photon, the first output signal or the second output signal may include the photon.

When the photon is detected in the first APD 100 (①), the first input terminal (+) of the differential amplifier 300 may receive a first pulse. In this instance, the first pulse may include a transient voltage spike component due to a photon detection signal and the gating pulse. That is, a signal including the same signal component may be applied to input terminals (the first input terminal (+) and the second input terminal (−)) of the differential amplifier 300.

The first output terminal (OUTP) of the differential amplifier 300 may amplify an output signal in which the transient voltage spike component is cancelled, and output an amplification result. On the other hand, the second output terminal (OUTN) of the differential amplifier 300 may amplify the output signal in which the transient voltage spike component is cancelled, and may invert an amplification result and thereby output the inverted amplification result.

Figure 2:
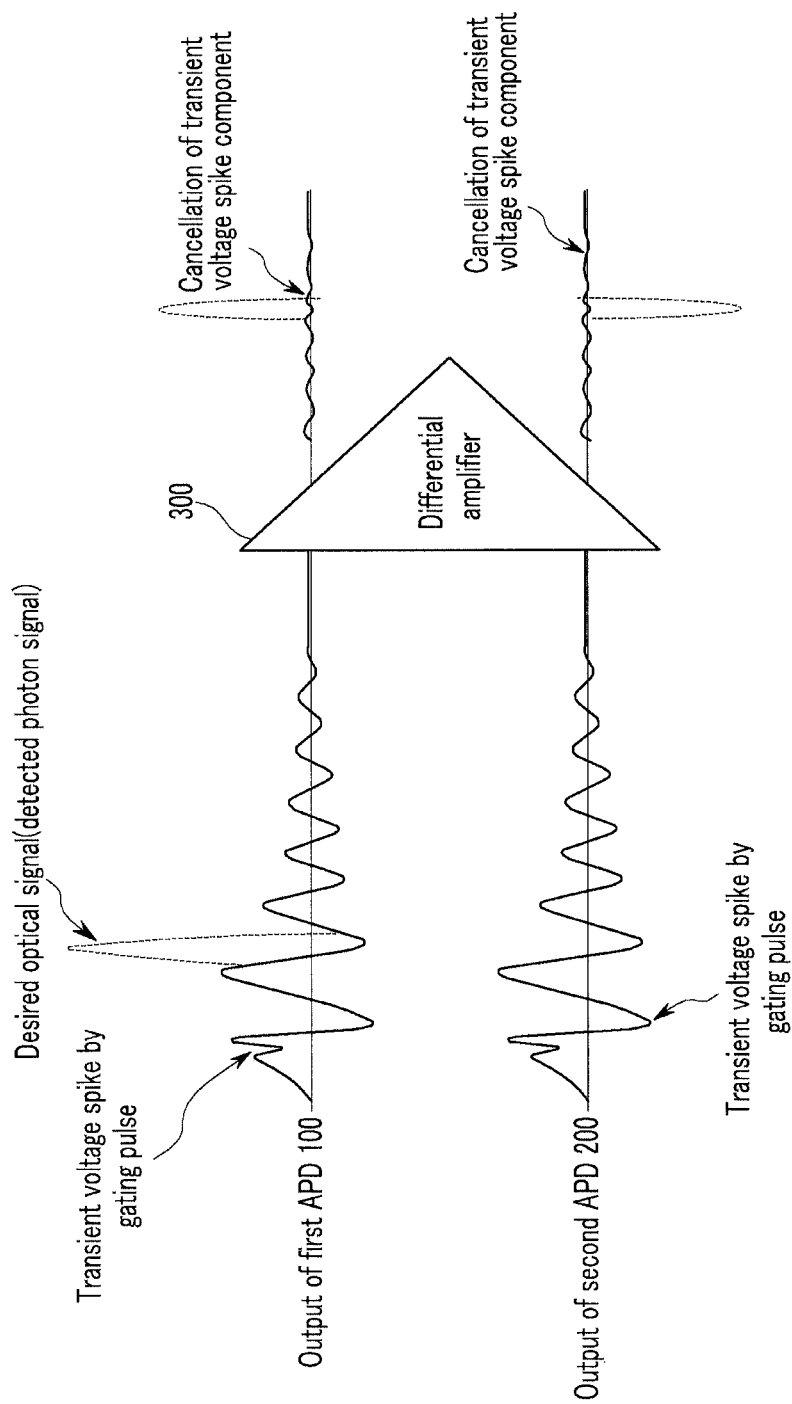
FIG. 2 is a diagram illustrating a process of cancelling a transient voltage spike via a differential amplifier according to an exemplary embodiment of the present invention.

As shown in FIG. 2, when the photon is detected in the first APD 100, and the photon is not detected in the second APD 200 (①), the same transient voltage spike may occur in an output terminal of each of the first APD 100 and the second APD 200 due to the same gating pulse.

The differential amplifier 300 may receive the first output signal and the second output signal via two input terminals, and may cancel an in-phase signal component, that is, the transient voltage spike component in the above two output signals.

As described above, the differential amplifier 300 may decrease an amplitude of gating pulse by cancelling the transient voltage spike component.

The transient voltage spike cancellation apparatus according to an exemplary embodiment of the present invention may increase a signal detection rate of an APD and improve the entire processing rate in a receiver of a quantum cryptography system by decreasing the amplitude of gating pulse, thereby.

When the photon is detected in the second APD 200 (②), the second input terminal (−) of the differential amplifier 300 may receive a second pulse.

The second output terminal (OUTN) of the differential amplifier 300 may amplify a photon component in which the transient voltage spike component is cancelled, and output the amplification result. On the other hand, the first output terminal (OUTP) of the differential amplifier 300 may amplify the photon component in which the transient voltage spike component is cancelled, and may invert an amplification result and thereby output the inverted amplification result.

When the photon is simultaneously detected in the first APD 100 and the second APD 200 (③), the first input terminal (+) and the second input terminal (−) of the differential amplifier 300 may receive a third pulse including an in-phase signal component. Then, the first output terminal (OUTP) and the second output terminal (OUTN) of the differential amplifier 300 may cancel the in-phase signal component and thereby output.

The first voltage comparator 400 and the second voltage comparator 500 may compare the signal transferred from the differential amplifier 300 with a reference voltage (Vref0 or Vref1). In this instance, a voltage level of the reference voltage may be arbitrarily set within each voltage comparator.

Next, when a voltage corresponding to the transferred signal is higher than the reference voltage, the first voltage comparator 400 and the second voltage comparator 500 may transfer a first voltage signal (e.g., "1") to the counter 600. When the voltage corresponding to the transferred signal is lower than the reference voltage, the first voltage comparator 400 and the second voltage comparator 500 may transfer a second voltage signal (e.g., "0") to the counter 600.

When the photon is detected in the first APD 100 (①), the first voltage comparator 400 may compare a first output terminal signal transferred from the first output terminal (OUTP) of the differential amplifier 300 with the reference voltage (Vref0).

When the first output terminal signal exists within the reference voltage, the first voltage comparator 400 may transfer, to the counter 600, the first voltage signal (e.g., "1") corresponding to a comparison result.

When the photon is detected in the first APD 100 (①), the second voltage comparator 500 may compare a second output terminal signal transferred from the second output terminal (OUTN) of the differential amplifier 300 with the reference voltage (Vref1). In this instance, the second output terminal signal may include a component corresponding to a reverse phase of the first output terminal signal.

When the second output terminal signal is out of the reference voltage (Vref1), the second voltage comparator 500 may transfer, to the counter 600, the second voltage signal (e.g., "0") corresponding to a comparison result.

The counter 600 may count a voltage signal having a specific value (e.g., "1") between the output signals of the first voltage comparator 400 and the second voltage comparator 500, that is, between the first voltage signal and the second voltage signal.

Hereinafter, a method for cancellation of a transient voltage spike component will be described in detail with reference to FIG. 3.

Figure 3:
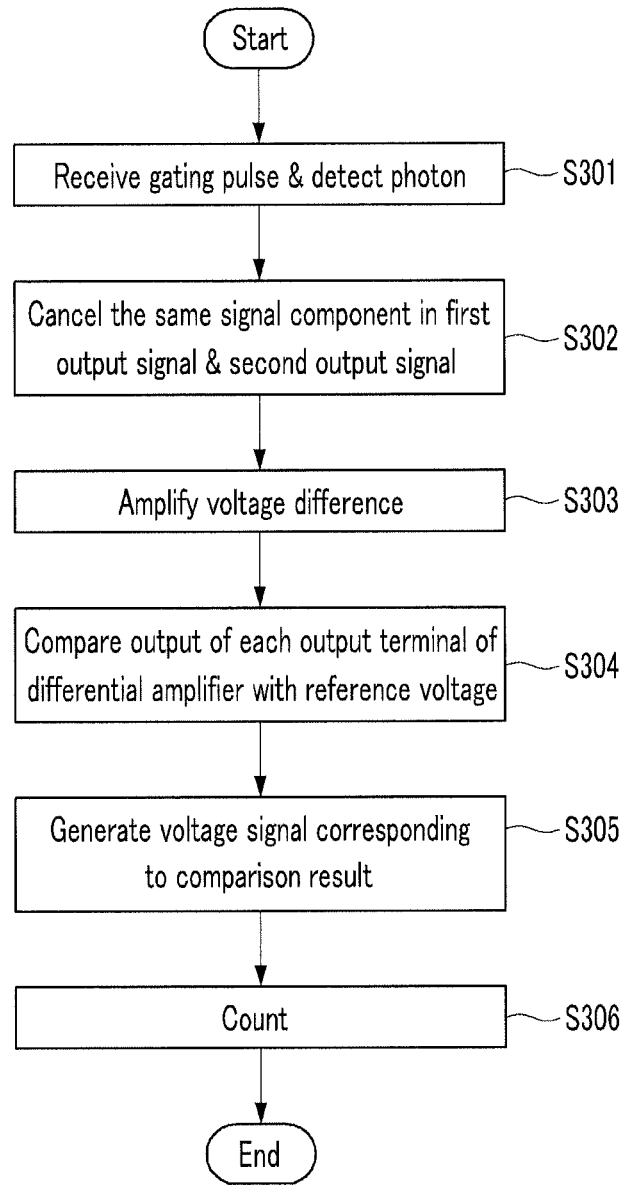
FIG. 3 is a flowchart illustrating a method for cancellation of a transient voltage spike according to an exemplary embodiment of the present invention.

FIG. 3 is a flowchart illustrating a method for cancellation of a transient voltage spike according to an exemplary embodiment of the present invention.

Initially, the transient voltage spike cancellation apparatus may include the first APD 100, the second APD 200, the differential amplifier 300, the first voltage comparator 400, the second voltage comparator 500, and the counter 600. In this instance, the first APD 100 and the second APD 200 may operate in a gated Geiger mode, and a transient voltage spike may occur in each output end.

Referring to FIG. 3, the transient voltage spike cancellation apparatus may be applied with a gating pulse and a direct current (DC) voltage corresponding to a breakdown voltage, and detect a photon in an optical signal including the gating pulse (S301). In this instance, the transient voltage spike cancellation apparatus may detect the photon using the first APD 100 and the second APD 200. Hereinafter, a method for cancellation of the transient voltage spike in a case where the photon is detected in the first APD 100 and the photon is not detected in the second APD 200 will be described.

The transient voltage spike cancellation apparatus may cancel the same signal component in a first output signal including the photon and a second output signal not including the photon (S302)

Next, the transient voltage spike cancellation apparatus may amplify a voltage difference between the first output signal and the second output signal in which the same signal component is cancelled, using the differential amplifier 300 (S303).

Specifically, the first output terminal (OUTP) of the differential amplifier 300 may amplify the output signal in which the transient voltage spike component is cancelled. On the other hand, the second output terminal (OUTN) of the differential amplifier 300 may amplify the output signal in which the transient voltage spike component is cancelled, and may invert the amplification result.

The transient voltage spike cancellation apparatus may compare a voltage corresponding to an output of each output terminal, that is, the output terminal signal of the differential amplifier 300 with a reference voltage (S304).

Specifically, the transient voltage spike cancellation apparatus may compare a first voltage corresponding to the output of the first output terminal (OUTP), that is, a first output terminal signal of the differential amplifier 300 with the reference voltage (Vref0). Also, the transient voltage spike cancellation apparatus may compare a second voltage corresponding to the output of the second output terminal (OUTN), that is, a second output terminal signal of the differential amplifier 300 with the reference voltage (Vref1).

The transient voltage spike cancellation apparatus may generate a voltage signal corresponding to a comparison result (S305).

For example, when the first voltage is higher than the reference voltage (Vref0), the transient voltage spike cancellation apparatus may generate the first voltage signal (e.g., "1"). On the other hand, when the second voltage is lower than the reference voltage (Vref1), the transient voltage spike cancellation apparatus may generate the second voltage signal (e.g., "0").

The transient voltage spike cancellation apparatus may count the first voltage signal which has a specific vale (e.g., "1") or the second voltage signal which has a specific vale (e.g., "0") (S306).

Accordingly, according to embodiments of the present invention, it is possible to cancel a transient voltage spike occurring in a signal output terminal of an avalanche photodiode operating in a gated Geiger mode, using a differential amplifier.

That is, according to an exemplary embodiment of the present invention, a signal output terminal of an avalanche photodiode operating in a gated Geiger mode may cancel a transient voltage spike using a single differential amplifier having differential input and output terminals.

Also, it is possible to down-size a receiver of a quantum cryptography system by cancelling a transient voltage spike occurring in a signal output terminal of an avalanche photodiode operating in a gated Geiger mode.

The above-mentioned exemplary embodiments of the present invention are not embodied only by an apparatus and method. Alternatively, the above-mentioned exemplary embodiments may be embodied by a program performing functions, which correspond to the configuration of the exemplary embodiments of the present invention, or a recording medium on which the program is recorded. These embodiments can be easily devised from the description of the above-mentioned exemplary embodiments by those skilled in the art to which the present invention pertains.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An apparatus for cancellation of a transient voltage spike, comprising:
   a first photodiode for detecting a photon in an optical signal input from an outside;
   a second photodiode for detecting a photon in an optical signal input from the outside; and
   a differential amplifier for canceling the same signal component in a first output signal of the first photodiode and a second output signal output from the second photodiode, and to amplify a voltage difference between the first output signal and the second output signal,
   wherein:
   a gating pulse and a direct current (DC) voltage corresponding to a breakdown voltage is applied to a cathode of each of the first photodiode and the second photodiode.

2. The apparatus of claim 1, wherein:
   when the first output signal includes the photon,
   the differential amplifier receives a first pulse via a first input terminal and a second input terminal, amplifies the voltage difference between the first output signal and the second output signal in which the same signal component is cancelled, outputs the amplified voltage difference through a first output terminal, inverts and outputs the amplified voltage difference through a second output terminal.

3. The apparatus of claim 1, wherein:
   when the second output signal includes the photon,
   the differential amplifier receives a second pulse via a first input terminal and a second input terminal,
   amplifies the voltage difference between the first output signal and the second output signal in which the same signal component is cancelled, inverts an amplification result, outputs the inverted amplification result through a first output terminal, and outputs the amplification result through a second output terminal.

4. The apparatus of claim 1, wherein:
   when both the first output signal and the second output signal include the photon,
   the differential amplifier receives a third pulse containing an in-phase signal component via a first input terminal and a second input terminal, and
   a first output terminal and a second output terminal of the differential amplifier cancel the in-phase signal component and thereby output.

5. The apparatus of claim 1, further comprising:
   a voltage comparator to compare a voltage corresponding to an output of the differential amplifier with a reference voltage, and to output a first voltage signal or a second voltage signal corresponding to a comparison result; and
   a counter to count the first voltage signal or the second voltage signal.

6. A method for cancelling, by an apparatus comprising a first photodiode, a second photodiode, and a differential amplifier, a transient voltage spike, comprising:
   providing with a gating pulse and a direct current (DC) voltage corresponding to a breakdown voltage;
   detecting, by each of the first photodiode and the second photodiode, a photon in an input optical signal; and receiving, by the differential amplifier, a first output signal of the first photodiode and a second output signal output from the second photodiode to cancel the same signal component included in the first output signal and the second output signal, thereby cancelling the transient voltage spike.

7. The method of claim 6, further comprising:

comparing a voltage corresponding to an output of the differential amplifier with a reference voltage;

generating a first voltage signal or a second voltage signal corresponding to a comparison result; and counting the generated first voltage signal or the second voltage signal.

\* \* \* \* \*